(12) United States Patent
Lee

(10) Patent No.: US 6,665,025 B2
(45) Date of Patent: Dec. 16, 2003

(54) LIQUID CRYSTAL DISPLAY DEVICE AND A METHOD FOR MANUFACTURING A GROUNDING DEVICE

(75) Inventor: Sang-Chul Lee, Kyonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/107,421

(22) Filed: Mar. 28, 2002

(65) Prior Publication Data

US 2002/0097353 A1 Jul. 25, 2002

Related U.S. Application Data

(62) Division of application No. 09/401,963, filed on Sep. 22, 1999.

(30) Foreign Application Priority Data

Sep. 24, 1998 (KR) .............................. 98-39585

(51) Int. Cl.$^7$ .............................................. G02F 1/1333
(52) U.S. Cl. ........................... 349/59; 349/58; 349/150; 349/152

(58) Field of Search ............................ 349/58, 62, 149, 349/150, 152; 361/742, 793, 794, 795, 799; 174/261, 255

(56) References Cited

U.S. PATENT DOCUMENTS 4,502,059 A * 2/1985 Blessington .................. 347/68
5,786,239 A * 7/1998 Ohsawa et al. .............. 438/123

FOREIGN PATENT DOCUMENTS

JP            402122993         *   5/1990

* cited by examiner

*Primary Examiner*—Robert H. Kim
*Assistant Examiner*—Hoan Nguyen
(74) *Attorney, Agent, or Firm*—McGuireWoods LLP

(57) ABSTRACT

An LCD device in which a plurality of grounding protrusions are formed in a region not having a signal transmission pattern among the bottom surface of a printed circuit board in contact with a bottom chassis so as to increase a contact area between the printed circuit board and the bottom chassis, to thereby prevent a damage caused by an electromagnetic wave and error of devices.

7 Claims, 6 Drawing Sheets

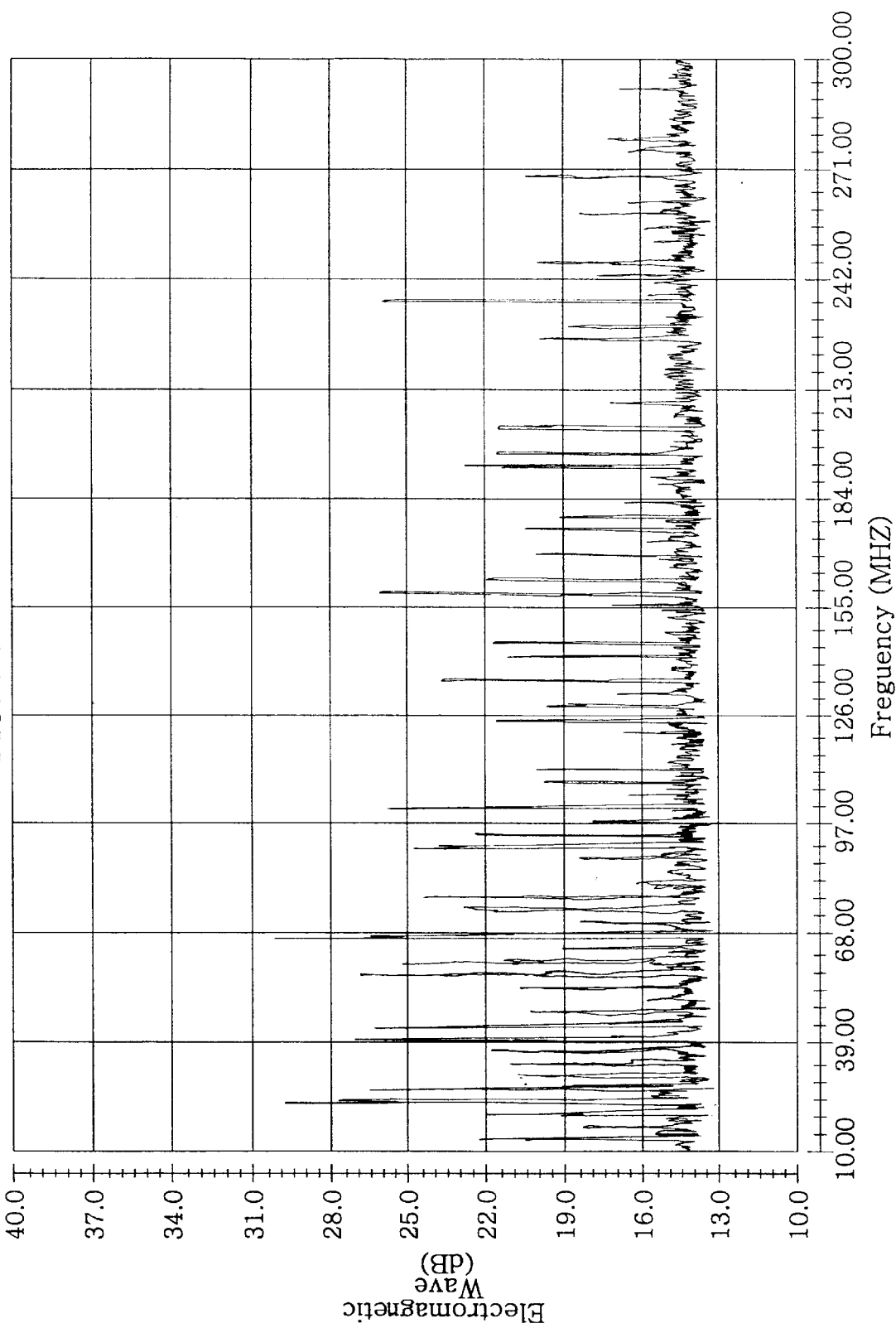

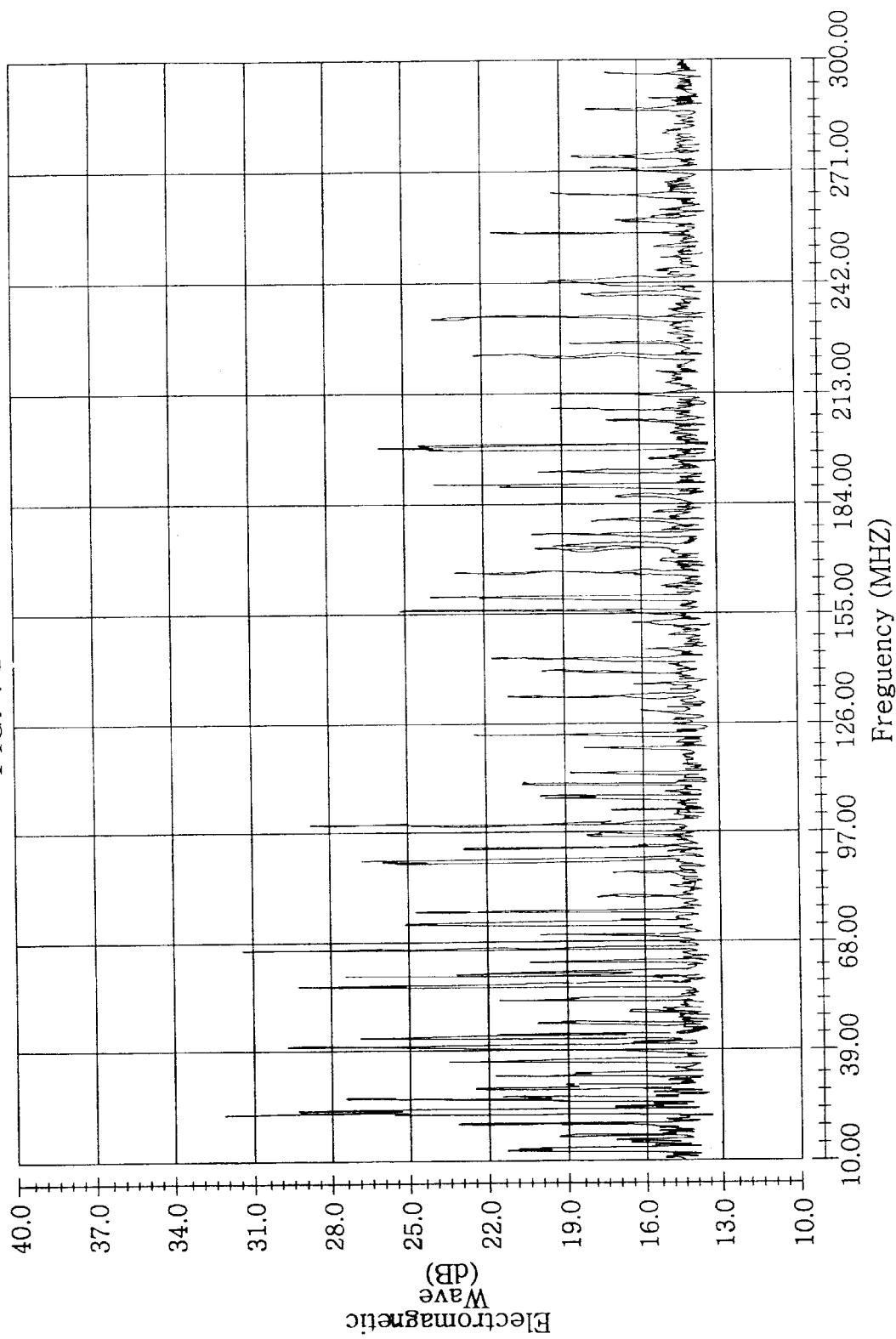

LIQUID CRYSTAL DISPLAY DEVICE AND A METHOD FOR MANUFACTURING A GROUNDING DEVICE

This is a Divisional Application of Ser. No. 09/,401,963 filed Sep. 22, 1999.

BACKGROUND OF THE INVENTION

1. Field of the Invention

The present invention relates to a liquid crystal display (LCD) device and a method for manufacturing a grounding device, and more particularly, to an LCD device that has a plurality of grounding protrusions in a region of the bottom surface of a printed circuit board that contacts a bottom chassis and does not have a signal transmission pattern. This increases a contact area between the printed circuit board and the bottom chassis and minimizes a damage caused by an electromagnetic wave.

2. Description of the Related Art

Generally, an LCD device is well accepted as a flat panel display. Especially, the smaller size, lighter weight and lower power consumption render the LCD device to replace the traditional cathode ray tube (CRT). LCD devices have been sufficiently developed to serve as a flat panel display device, and are used as a monitor for a lap-top computer and even for a desktop computer. Thus, LCD devices are gaining popularity.

Unlike CRTs, LCD devices are light emitting elements that adjust the amount of the light applied from an external device and display images on the screen. Therefore, an additional light source, say, a backlight unit, for irradiating the light onto the LCD panel is required.

Such a backlight assembly is composed of a mold frame, a lamp assembly contained in the mold frame and emitting a light, a light guide contained in the mold frame and guiding the light toward an LCD panel, a bottom chassis installed at the bottom surface of the mold frame and supporting members contained in the mold frame, and a top chassis combined with the mold frame to support the LCD panel.

An LCD device employed as a monitor for a desktop computer has a mold frame and a metal bottom chassis. A metal structure builds a stronger LCD device and shields the device from an electromagnetic wave. It further helps an LCD device discharge a large amount of heat generated when a lamp assembly emits a strong light to match a CRT display.

As shown in FIG. 1, if a printed circuit board (PCB) 90 connected to the LCD panel through a tape carrier package (TCP) 75 to drive an LCD panel (not shown) is positioned at the rear surface of a bottom chassis 60, via holes 92 formed at the bottom surface of PCB 90 as shown in FIG. 2 contact bottom chassis 60, which may short electric signals. Therefore, an insulator sheet 85 is inserted between bottom chassis 60 and PCB 90. Reference numeral 80 denotes a top chassis.

Most of driving elements 94 mounted onto PCB 90 to drive the LCD panel operate at a high frequency, and thus generate an electromagnetic interference (EMI). Such an EMI may interfere the electric signal transmitting to the LCD panel, and further cause an error in other devices when discharged to the outside of an LCD device 1.

To reduce EMI, as shown in FIG. 2, a metal film 97 at the corner of PCB 90 is exposed by partially removing a solder resist film on metal film 97, and a screw hole 96 is formed at the exposed portion of metal film 97. Then, PCB 90 is fixed to bottom chassis 60 using a screw 95, in order to ground an EMI to bottom chassis 60.

A grounding via hole 92' connects a grounding pattern (not shown) formed at the top surface of PCB 90 and metal film 97 formed at the bottom surface of PCB 90, and has a bridge 93 that connects metal film 97 at its periphery.

However, as described above, since the PCB contacts the bottom chassis only at its corners, the contact area between the PCB and the bottom chassis is limited. Thus, a large amount of EMI generated from the PCB are not grounded to the bottom chassis and may cause an interference with an electric signal applied to the LCD panel. As a result, an LCD device has a degraded screen quality, and the EMI discharged to the outside of the LCD device may cause an error in other devices.

The PCB contacts the bottom chassis ony at its corners because a light guide is installed all over the whole area of a mold frame except its edges corresponding to edges of the PCB.

Moreover, an LCD device used for a monitor has a problem of low productivity caused by an insulator sheet mounting process between the bottom chassis and the PCB in order to insulate the bottom chassis from the PCB.

SUMMARY OF THE INVENTION

It is therefore an object of the present invention to increase a contact area between a printed circuit board (PCB) and a bottom chassis to minimize an electromagnetic wave interference and enhance a product's reliability.

It is another object of the present invention to eliminate an insulator sheet attached between a PCB and a bottom chassis.

To achieve the above objects and other advantages, there is provided a liquid crystal display device in which a metal film of the bottom surface of the PCB that contacts a bottom chassis and does not have a signal transmission pattern is exposed by removing partially a solder resist film on the metal film and a conductive substance is deposited onto the exposed metal film to form a plurality of grounding protrusions, to thereby extend a contact area between the PCB and the bottom chassis.

BRIEF DESCRIPTION OF THE DRAWINGS

The above object and other advantages of the present invention will become more apparent by describing in detail the preferred embodiments thereof with reference to the accompanying drawings, in which:

FIG. 7A is a graphical representation showing an electromagnetic wave value emitting from the LCD device for a monitor according to the present invention, and FIG. 7B is a graphical representation showing an electromagnetic wave value emitting from the conventional LCD device for a monitor.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein.

The structure of the LCD device of the present invention will be explained with reference to FIGS. 3 to 5.

Figure 5:
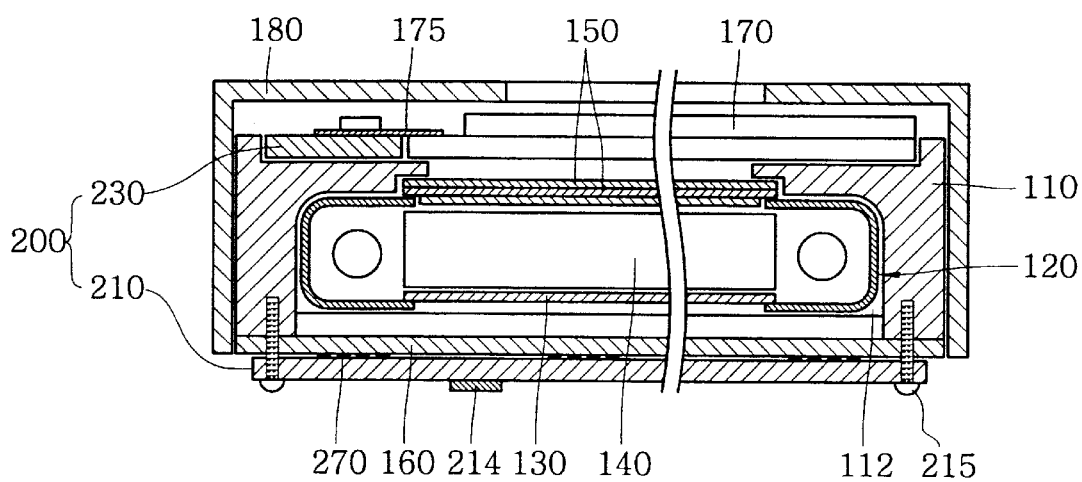
FIG. 5 is a section view taken along line I—I of FIG. 3.

Referring to FIG. 5, an LCD device 100 includes a mold frame 110, a lamp assembly 120 installed in mold frame 110 and emitting a light, a reflector 130, a light guide 140, a series of optical sheets 150 that are sequentially mounted onto mold frame 110 and reflect, guide, and focus the light, a bottom chassis 160 installed at the bottom surface of mold frame 110 supporting each member contained in mold frame 110, an LCD panel 170 mounted onto optical sheets 150 displaying data, a printed circuit board (PCB) 200 driving LCD panel 170, a grounding protrusion 270 formed to PCB 200 and providing a grounding path of an electromagnetic wave, and a top chassis 180 connected to mold frame 110 to prevent LCD panel 170 from escaping from mold frame 110.

As shown in FIG. 5, a receiving space 112 formed along the edges of mold frame 110 sequentially accommodates lamp assembly 120, reflector 130, light guide 140, optical sheets 150, and LCD panel 170.

Figure 1:
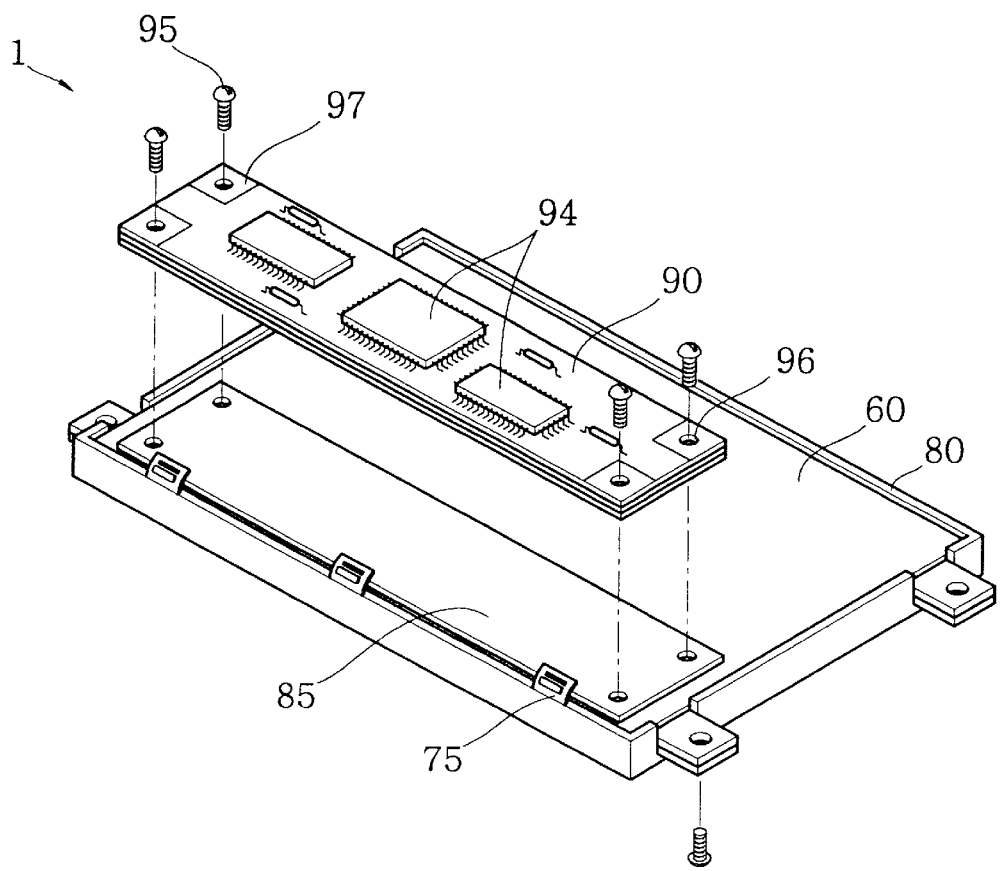
FIG. 1 is a detailed perspective view showing a rear surface of a conventional LCD device for a monitor.
Figure 2:
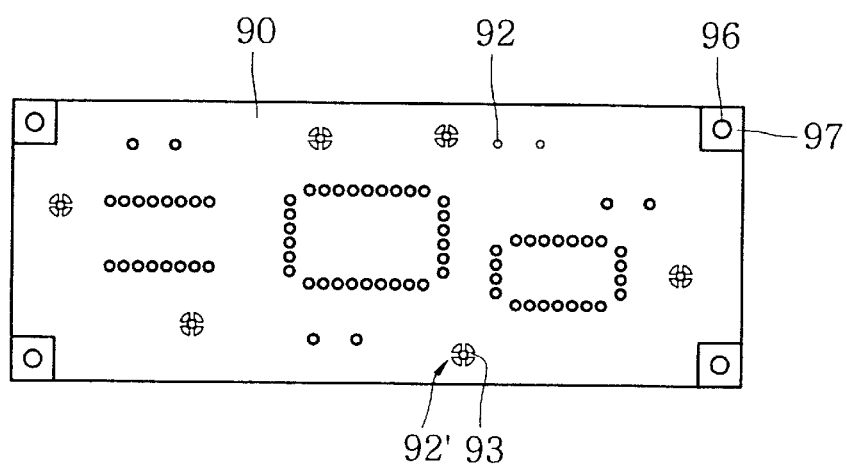
FIG. 2 is a plan view showing a rear surface of a conventional printed circuit board.
Figure 3:
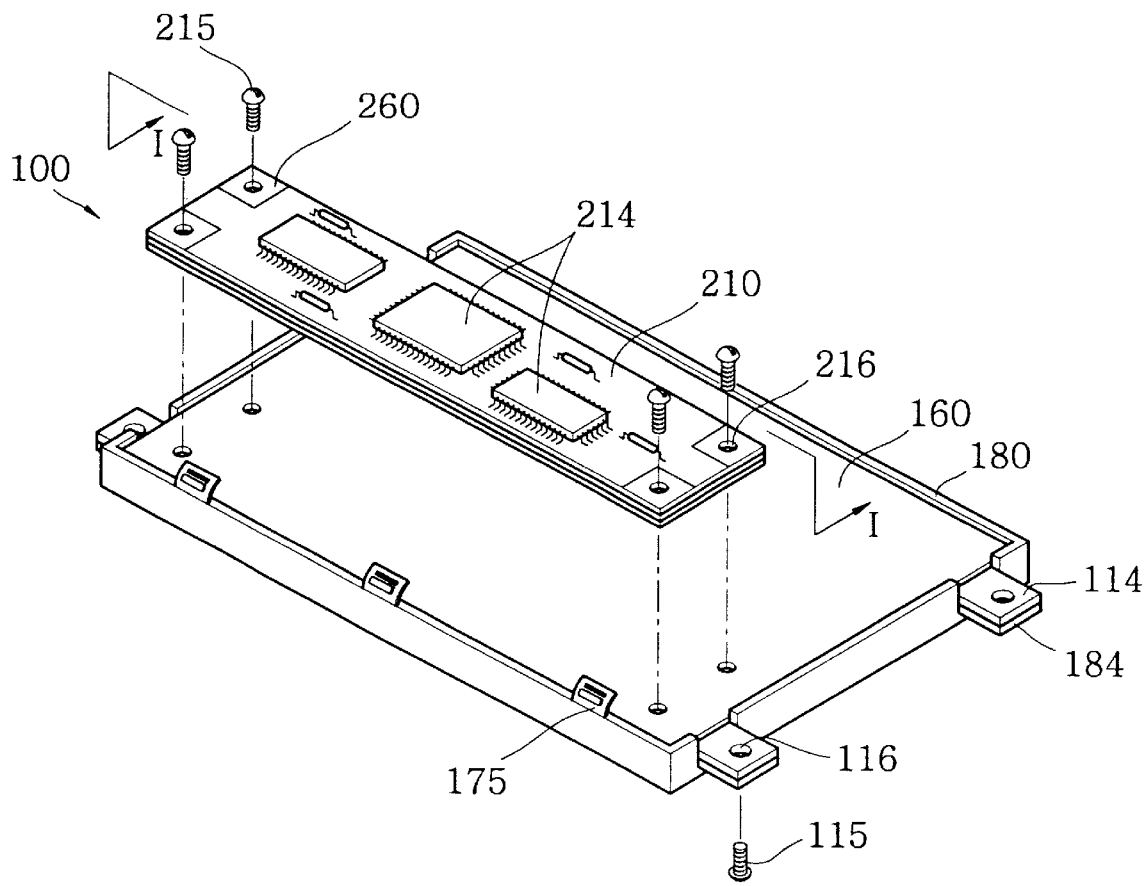
FIG. 3 is a detailed perspective view showing a rear surface of an LCD device for a monitor according to the present invention.

As shown in FIG. 3, mold frame 110 has at its outer surface a plurality of mold frame mounting portions 114 to fix LCD device 100 to a monitor case (not shown). The mold frame mounting portions 114 are formed at the outer surfaces in lengthwise direction, and a screw hole 116 to accommodate a mounting screw 115 is formed at the center of each mold frame mounting portion 114.

Bottom chassis 160 closes the bottom surface of mold frame 110 and contains inside the receiving space 112, lamp assembly 120, reflector 130, light guide 140, optical sheets 150.

Preferably, mold frame 110 and bottom chassis 160 are made up of a metal in order to strengthen the LCD device, prevent an EMI, and rapidly discharge a high temperature heat (approximately 60° C. to 70° C.) generated from lamp assembly 120.

Figure 4:
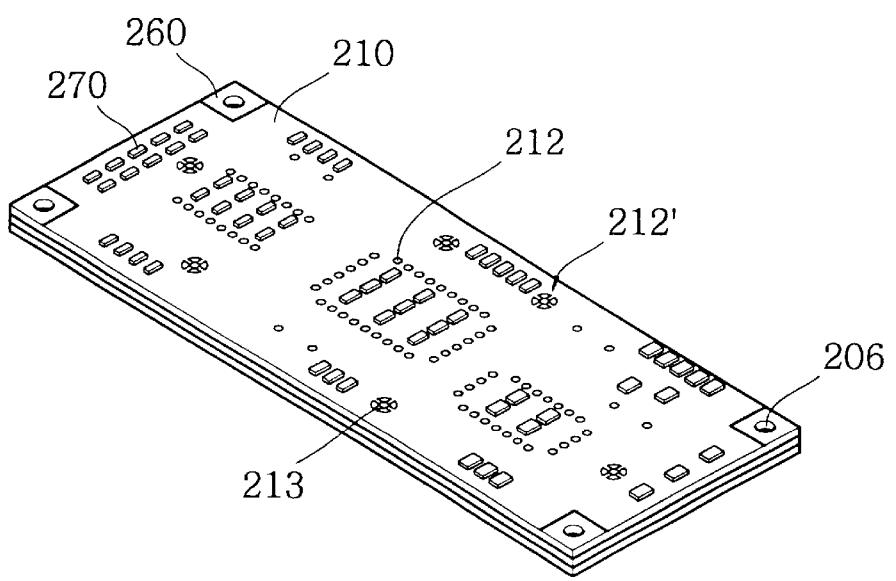
FIG. 4 is a perspective view showing a rear surface of a printed circuit board according to the present invention.

As shown in FIG. 3 or 4, PCB 200 has a plurality of hard plates with a signal pattern deposited into multi-layers. The signal patterns formed on each layer are interconnected by via holes 212 and grounding via holes 212'. Solder resist films for protecting signal patterns, via holes 212, and grounding via holes 212' are formed onto the top and bottom surfaces of PCB 200.

Here, the bottom surface of PCB 200 that contacts bottom chassis 160 does not have signal patterns for transmitting signals to LCD panel 170, but has via hole 212 and via hole 212' for electrically interconnecting signal patterns formed in each layer. In addition, a metal film is deposited all over the bottom surface of PCB 200 so as not to contact via holes 212. Grounding via hole 212' has at its periphery a bridge 213 for connecting a metal film 260 to grounding via hole 212'.

Active driving elements 214 for driving LCD panel 170 mount onto the top surface of PCB 200. Here, a gate PCB 230 connected in a lengthwise direction to LCD panel 170 lies in mold frame 110 in parallel with LCD panel 170, and a source PCB 210 connected in a widthwise direction to LCD panel 170 lies on the rear surface of bottom chassis 160 by bending TCP 175 and attaches to bottom chassis 160 by a screw 215.

Screw holes 216 accommodating screws 215 are at each corner of a source PCB 210. Those corners having screw holes 216 do not have a solder resist film to expose metal film 260, providing a grounding path for an electromagnetic wave.

Gate PCB 230 drives a gate line (not shown) of LCD panel 170 and has inactive driving elements mounted. Source PCB 210 drives a data line (not shown) of LCD panel 170 and has active driving elements 214 driven by a high frequency signal mounted.

Referring to FIG. 4, PCB 200 has grounding protrusions 270 at its bottom surface contacting bottom chassis 160. Grounding protrusions 270 grounds the electromagnetic wave discharged from PCB 200 toward bottom chassis 160. Mainly, source PCB 210 that generates a large amount of electromagnetic waves due to active driving elements 214 has grounding protrusions 270.

A plurality of grounding protrusions 270 are formed by depositing a conductive substance to have a predetermined size and height on the bottom surface of source PCB 210 that does not have via hole 212 and grounding via hole 212'. Grounding protrusions 270 directly contact bottom chassis 160 to ground toward bottom chassis 160 the electromagnetic wave generated from source PCB 210, and prevent via holes 212 from contacting bottom chassis 160.

Preferably, grounding protrusions are made up of a lead.

Now, the process of forming such a grounding protrusion will be explained with reference to FIGS. 6A to 6C.

Figure 6A:
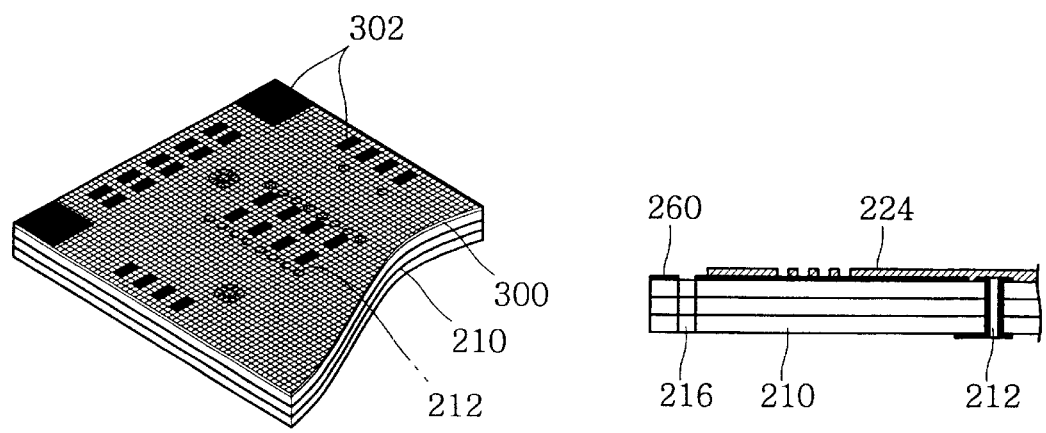
FIGS. 6A to 6C illustrate a process of forming a grounding portion.

As shown in FIG. 6A, a first mask 300 having a plurality of predetermined-sized closures 302 formed in its region corresponding to the place for screw hole 216 and grounding protrusions 270 is mounted onto the bottom surface of source PCB 210. That is, first mask 303 has a plurality of closures 302 formed at each edge of source PCB 210, and at some places where via holes 212 and grounding via holes 212' are not formed. Here, first mask 300 is made up of a non-woven fabric.

Subsequently, a solder resist solution is deposited onto first mask 300 to protect via hole 212 and metal film 260 from an external environment. Thus, a solder resist film 224 forms at the bottom surface of source PCB 210 facing the bottom chassis. At this time, solder resist film 224 does not form at the portion corresponding to closures 302 of first mask 300, thus allowing metal film 260 to be exposed.

Figure 6B:
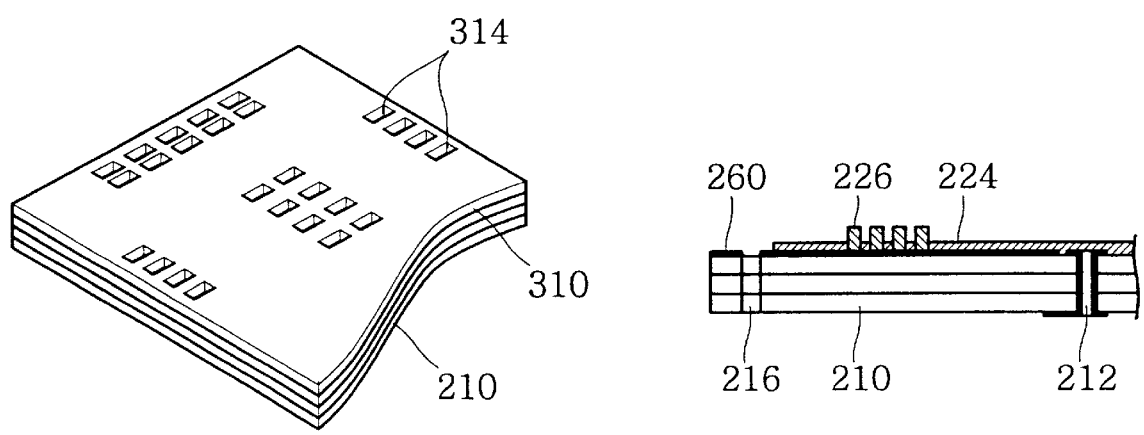

As shown in FIG. 6B, a second mask 310 having apertures 314 in the region where metal film 260 is exposed, with other region closed, is placed onto solder resist film 224.

Then, a gel solder cream is deposited over second mask 310. Here, the solder cream is introduced and fills apertures 314 of second mask 310. When second mask 310 is removed, a solder cream 226 having a predetermined height is left on the exposed metal film 260. Edges of second mask 310 corresponding to those of source PCB 210 may be closed.

Figure 6C:
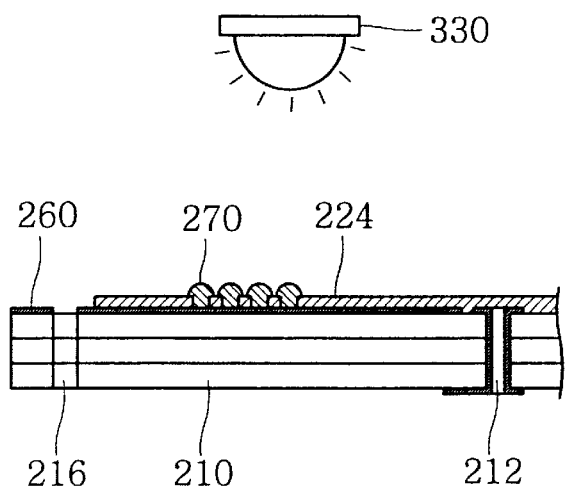

Then, as shown in FIG. 6C, ultraviolet rays and heats are applied to solder cream 226 to stiffen solder cream 226. As a result, a plurality of grounding protrusions 270 having predetermined size and height are formed at the bottom surface of source PCB 210.

Here, the grounding protrusions 270 may be formed all over metal film 260, or partially onto metal film 260 as shown in FIG. 4. Reference numeral 330 denotes an ultraviolet ray lamp.

Top chassis 180 is made of a metal, and is combined with mold frame 110 to accommodate a predetermined area of edges of LCD panel 170 and an outer surface of mold frame 100. A top chassis mounting portion 184 corresponds to mold frame mounting portion 114.

An assembly process of the LCD device and a grounding process will be explained hereinafter.

Mold frame 110 is turned upside down so that the opening formed at its bottom surface can be exposed, and lamp assembly 120 for radiating a light is installed in receiving spaces 112 facing each other. Then, a series of optical sheets 150 for diffusing and focusing a light, light guide 140 for guiding toward LCD panel 170 the light emitted from lamp assembly 120, and reflector 130 for reflecting the light coming from light guide 140 are sequentially put into receiving space 112.

Subsequently, bottom chassis 160 made of a metal is coupled to the bottom surface of mold frame 110 to prevent lamp assembly 120, reflector 130, light guide 140, optical sheets 150 from escaping from mold frame 110.

TCP 175 is provided in the lengthwise end portion of LCD panel 170 to connect gate PCB 230, and source PCB 210 connects to the widthwise end portion of LCD panel 170 through TCP 175.

When bottom chassis 160 is coupled to the bottom surface of mold frame 110, mold frame 110 is again turned upside down so that the opening formed at its top surface can be exposed. Subsequently, LCD panel 170 having gate PCB 230 and source PCB 210 connected is placed onto optical sheets 150.

Then, gate PCB 230 connected to the lengthwise end portion of LCD panel 170 lies parallel with the top surface of mold frame 110. Source PCB 210 connected to the widthwise end portion of LCD panel 170 is bent to the rear surface of bottom chassis 160 by bending TCP 175. Source PCB 210 attaches at its four corners to bottom chassis 160 using screws 215. At this time, grounding protrusion 270 protruded from the bottom surface of source PCB 210 directly contacts bottom chassis 160. Grounding protrusion 270 also makes a room for via holes 212 to keep distance from bottom chassis 160, while transmitting to bottom chassis 160 an electromagnetic wave generated from source PCB 210.

Then, top chassis 180 is mounted onto the mold frame 110 to secure LCD panel 170 with mold frame 110.

The LCD device 100 is assembled to a monitor case by fastening mounting screw 115 into screw hole 116.

When the LCD device 100 of the present invention operates, a high frequency signal applies to active driving elements 214 on source PCB 210 and generates a large amount of electromagnetic wave.

The electromagnetic wave generated from source PCB 210 partially moves toward bottom chassis 160 by screw 215 the head of which contacts metal film 260, and the residual electromagnetic wave moves toward bottom chassis 160 via a plurality of protrusions 270 directly contacting bottom chassis 160. The electromagnetic wave generated from active driving elements 214 transmitts via grounding via hole 212' to metal film 260 formed at the bottom surface of source PCB 210. Then, the electromagnetic wave transmitted to metal film 260 goes again to grounding protrusion 270, and dissipates to bottom chassis 160.

As aforementioned, a plurality of grounding protrusions 270 formed to a predetermined size into a portion where via holes 212 are not formed, increases a contact area between bottom chassis 160 and source PCB 210, thereby enforcing a shield against the electromagnetic wave.

The electromagnetic wave then transmits to a grounding terminal of the monitor case via mold frame mounting portion 114, top chassis mounting portion 184, and screw 115. Thus, the electromagnetic wave from source PCB 210 is completely grounded.

When driving the LCD panel of the present invention and a conventional LCD panel, the electromagnetic wave of both panels is measured in an enclosed space using a noise scanner. The highest electromagnetic wave for the LCD panel of the present invention is approximately 29.4 dB at the frequency of approximately 21.6 MHz, as shown in FIG. 7A.

In the meantime, the highest electromagnetic wave for the conventional LCD panel is approximately 33.4 dB at the frequency of approximately 21.6 MHz, as shown in FIG. 7B.

A plurality of grounding protrusions formed on the source PCB increases a contact area between the bottom chassis and the PCB. Thus, the highest electromagnetic wave generated from the LCD panel of the present invention is 4dB lower than that of the electromagnetic wave generated from the conventional LCD panel.

Since the grounding protrusions are formed to a predetermined height from the bottom surface of the source PCB, the via hole and the metal pattern formed at the bottom surface of the PCB do not contact the bottom chassis, eliminating the necessity for the insulation between the PCB and the bottom chassis.

The present invention has the following benefits.

A plurality of grounding protrusions having a predetermined size and height are formed in the region where via holes are not formed, on the bottom surface of the PCB contacting the bottom chassis. Thus, it increases a contact area between the PCB and the bottom chassis, minimizing a damage caused by an electromagnetic wave and enhancing LCD device's reliability.

When the PCB is fixed onto the rear surface of the bottom chassis, the via hole for transmitting an electric signal does not contact the bottom chassis due to the grounding protrusion. This eliminates a process of insulating between the bottom chassis and the PCB.

This invention has been described above with reference to the aforementioned embodiments. It is evident, however, that many alternative modifications and variations will be apparent to those having skills in the art in light of the foregoing description. Accordingly, the present invention embraces all such alternative modifications and variations as fall within the spirit and scope of the appended claims.

What is claimed is:

1. A method for manufacturing a printed circuit board (PCB), the PCB having a signal transmission pattern and a metal film formed on a bottom surface thereof, the metal film formed where a conductive fixing element is accommodated to fix the PCB to a conductive housing and electrically connected to the fixing element, the method comprising the steps of:

forming a first mask to block a portion of the bottom surface where a the signal transmission pattern is not formed;

forming a solder resist film on the first mask to cover the signal transmission pattern, wherein the solder resist film is not formed on the portion blocked by the first mask; and forming a grounding protrusion on the portion blocked by the first mask and not covered by the solder resist film, wherein the grounding protrusion has a height large enough to be electrically connected to the metal film via the conductive housing when the PCB is fixed to the conductive housing by the conductive fixing element.

2. The method according to claim 1, wherein the first mask is a non-woven fabric.

3. The method according to claim 2, wherein the step of forming the ground protrusion comprising the steps of:

forming a second mask to expose the portion blocked by the first mask and not covered by the solder resist film;

depositing a conductive material to form the ground protrusion selectively on the portion blocked by the first mask and exposed by the second mask.

4. The method according to claim 1, wherein the ground protrusion has a height greater than a thickness of said solder resist film.

5. The method according to claim 1, wherein more than two ground protrusions are formed on the bottom surface.

6. The method according to claim 1, wherein the conductive material is solder cream.

7. The method according to claim 6, further comprising the step of hardening the solder cream by applying an ultraviolet ray and a heat onto the PCB.

* * * * *